(12) United States Patent
Yoo et al.

(10) Patent No.: US 9,368,373 B2
(45) Date of Patent: Jun. 14, 2016

(54) METHOD OF JOINING SEMICONDUCTOR SUBSTRATE

(71) Applicant: Hyundai Motor Company, Seoul (KR)

(72) Inventors: Ilseon Yoo, Seoul (KR); Hiwon Lee, Seoul (KR); Soon-myung Kwon, Gyeonggi-Do (KR); Hyunsoo Kim, Seoul (KR)

(73) Assignee: Hyundai Motor Company, Seoul (KR)

( * ) Notice: Subject to any disclaimer, the term of this patent is extended or adjusted under 35 U.S.C. 154(b) by 2 days.

(21) Appl. No.: 14/319,324

(22) Filed: Jun. 30, 2014

(65) Prior Publication Data

US 2015/0187604 A1    Jul. 2, 2015

(30) Foreign Application Priority Data

Dec. 30, 2013  (KR) .......................... 10-2013-0167809

(51) Int. Cl.
| | |
|---|---|
| *H01L 21/50* | (2006.01) |
| *H01L 21/308* | (2006.01) |
| *H01L 21/306* | (2006.01) |
| *H01L 21/18* | (2006.01) |

(52) U.S. Cl.
CPC .............. *H01L 21/50* (2013.01); *H01L 21/185* (2013.01); *H01L 21/308* (2013.01); *H01L 21/30604* (2013.01)

(58) Field of Classification Search
CPC ............ H01L 21/30604; H01L 21/308; H01L 21/31144; H01L 21/50; H01L 2221/68363; H01L 2223/54426; B81C 2203/058; B81C 3/002

USPC ................... 438/106, 107, 455; 257/678, 797
See application file for complete search history.

(56) References Cited

U.S. PATENT DOCUMENTS

| | | | | |
|---|---|---|---|---|
| 5,545,291 | A * | 8/1996 | Smith et al. .................... | 438/107 |
| 6,114,221 | A * | 9/2000 | Tonti et al. .................... | 438/455 |
| 7,622,813 | B2 | 11/2009 | Brewer | |
| 2003/0042602 | A1* | 3/2003 | Drost ............................ | 257/723 |
| 2008/0305410 | A1* | 12/2008 | Bae ................................ | 430/5 |

FOREIGN PATENT DOCUMENTS

| | | |
|---|---|---|
| KR | 10-2003-0094454 | 12/2003 |
| KR | 10-2011-0021292 | 3/2011 |

\* cited by examiner

*Primary Examiner* — David Vu
*Assistant Examiner* — Jonathan Han
(74) *Attorney, Agent, or Firm* — Mintz Levin Cohn Ferris Glovsky and Popeo, P.C.; Peter F. Corless

(57) ABSTRACT

A method of joining semiconductor substrates includes: forming an alignment key on a first semiconductor substrate; forming a first protrusion and a second protrusion, and an alignment recess positioned between the first protrusion and the second protrusion on a second semiconductor substrate; forming a first metal layer and a second metal layer on the first protrusion and the second protrusion, respectively; and joining the first semiconductor substrate and the second semiconductor substrate, in which the alignment key is positioned at the alignment recess when the first semiconductor substrate and the second semiconductor substrate are joined.

5 Claims, 3 Drawing Sheets

METHOD OF JOINING SEMICONDUCTOR SUBSTRATE

CROSS-REFERENCE TO RELATED APPLICATIONS

This application claims under 35 U.S.C. §119(a) priority to and the benefit of Korean Patent Application No. 10-2013-0167809 filed in the Korean Intellectual Property Office on Dec. 30, 2013, the entire contents of which are incorporated herein by reference.

BACKGROUND (a) Field of the Invention

The present invention relates to a method of joining semiconductor substrates. More particularly, the present invention relates to a method of joining semiconductor substrates in which metal layers are formed.

(b) Description of the Related Art

In general, a metal layer and an insulating layer are deposited, or a micro pattern is formed, on one semiconductor substrate to form a semiconductor device. Further, the semiconductor device may also be formed by joining two or more semiconductor substrates on which a thin film layer, such as the metal layer and the insulating layer, and the micro pattern are formed.

A semiconductor substrate means a substrate obtained by growing a raw material of a semiconductor and single-crystallizing the raw material of the semiconductor like a rod, thinly die-cutting the singularly-crystallized raw material of the semiconductor according to crystal orientation, and grinding and polishing the die-cut semiconductor raw material, and is also referred to as a wafer.

When two or more semiconductor substrates are joined, an error generated during alignment of the semiconductor substrates must be considered, in general, in the alignment of semiconductor substrates, alignment keys formed in the semiconductor substrates are adjusted by using an optical measurement method to join the semiconductor substrates. However, in this case, a fine error may also be generated. Further, an alignment error by thermal expansion may be generated during a plurality of joining processes, or a metal layer may re-flow due to heat or pressure during the joining, so that a defect may be generated.

The above information disclosed in this Background section is only for enhancement of understanding of the background of the invention and therefore it may contain information that does not form the prior art that is already known in this country to a person of ordinary skill in the art.

SUMMARY

The present invention is directed to preventing a metal layer from re-flowing when semiconductor substrates, in which the metal layer is formed, are joined.

An exemplary embodiment of the present invention provides a method of joining semiconductor substrates, including: forming an alignment key on a first semiconductor substrate; forming a first protrusion and a second protrusion, and an alignment recess positioned between the first protrusion and the second protrusion on a second semiconductor substrate; forming a first metal layer and a second metal layer on the first protrusion and the second protrusion, respectively; and joining the first semiconductor substrate and the second semiconductor substrate, in which the alignment key is positioned at the alignment recess when the first semiconductor substrate and the second semiconductor substrate are joined.

A thickness of the alignment key may be larger than a thickness of the first metal layer and the second metal layer.

The alignment key may be formed of a photosensitive polymer material.

The forming of the first protrusion, the second protrusion, and the alignment recess may include: forming a first photosensitive film pattern on the second semiconductor substrate; and etching the second semiconductor substrate by using the first photosensitive film pattern as a mask.

The forming of the first metal layer and the second metal layer may include: forming a second photosensitive film pattern on the second semiconductor substrate, except for the first protrusion and the second protrusion; forming a metal layer on the second photosensitive film pattern, the first protrusion, and the second protrusion; and removing the second photosensitive film pattern and the metal layer positioned on the second photosensitive film pattern by performing a liftoff process.

The method may further include forming an insulating layer on the first semiconductor substrate before forming the alignment key.

As described above, according to the exemplary embodiment of the present invention, the alignment key is positioned at the alignment recess when the first semiconductor substrate and the second semiconductor substrate are joined, thereby joining the first semiconductor substrate and the second semiconductor substrate without an alignment error.

Further, it is possible to easily form the alignment key by using a photosensitive polymer material.

Further, a thickness of the alignment key is formed to be larger than a thickness of the metal layers, thereby preventing the metal layers from re-flowing and flowing down to be connected with each other when the first semiconductor substrate and the second semiconductor substrate are joined.

DETAILED DESCRIPTION OF THE EMBODIMENTS

Figure 1:
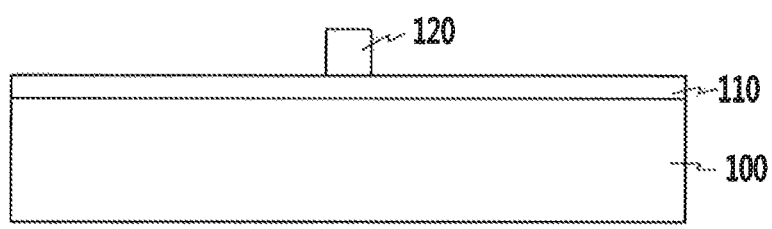
FIGS. 1 to 6 are cross-sectional views illustrating a process of joining semiconductor substrates according to an exemplary embodiment of the present invention.

Exemplary embodiments of the present invention will be described in detail with reference to the accompanying drawings. As those skilled in the art would realize, the described embodiments may be modified in various different ways, all without departing from the spirit or scope of the present invention. The exemplary embodiments that are disclosed herein are provided so that the disclosed contents may become thorough and complete and the spirit of the present invention may be sufficiently understood to a person of an ordinary skill in the art.

In the drawings, the thickness of layers and regions are exaggerated for clarity. In addition, in the case when it is mentioned that a layer is present "on" the other layer or a substrate, the layer may be directly formed on the other layer or the substrate or a third layer may be interposed therebetween. Like reference numerals designate like constituent elements throughout the specification.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

A process of joining semiconductor substrates according to an exemplary embodiment of the present invention will be described with reference to FIGS. 1 to 6.

Hereinafter, a process of joining two semiconductor substrates will be described in the present exemplary embodiment. However, the present invention is not limited thereto, and three or more semiconductor substrates may be joined by the joining method.

FIGS. 1 to 6 are cross-sectional views illustrating a process of joining semiconductor substrates according to an exemplary embodiment of the present invention.

Referring to FIG. 1, a first semiconductor substrate 100 is prepared, and then an insulating layer 110 is formed on the first semiconductor substrate 100 and an alignment key 120 is formed.

The insulating layer 110 may be formed of an insulating material, such as silicon oxide ($SiO_2$). The alignment key 120 may be formed of a photosensitive polymer material. For example, the alignment key 120 may be formed by forming a photosensitive polymer material layer on the insulating layer 110 by using a photosensitive polymer material, and then etching the photosensitive polymer material layer. As described above, the alignment key 120 is formed by using a photosensitive polymer material, thereby easily forming the alignment key 120.

Figure 2:
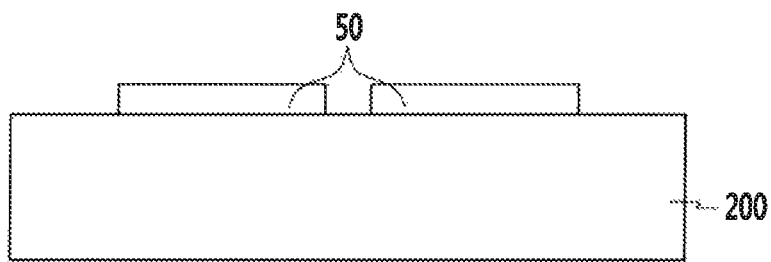
Figure 3:
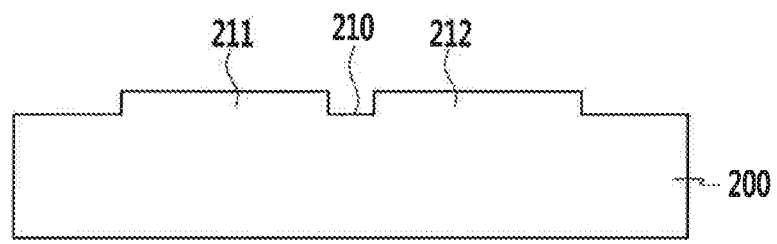

Referring to FIGS. 2 and 3, a second semiconductor substrate 200 is prepared, and then a first photosensitive film pattern 50 is formed on the second semiconductor substrate 200, and the second semiconductor substrate 200 is etched by using the first photosensitive film pattern 50 as a mask. The etching may be performed through dry etching or wet etching.

Through the etching, an alignment recess 210, a first protrusion 211, and a second protrusion 212 are formed on the second semiconductor substrate 200. The alignment recess 210 is positioned between the first protrusion 211 and the second protrusion 212.

Figure 4:
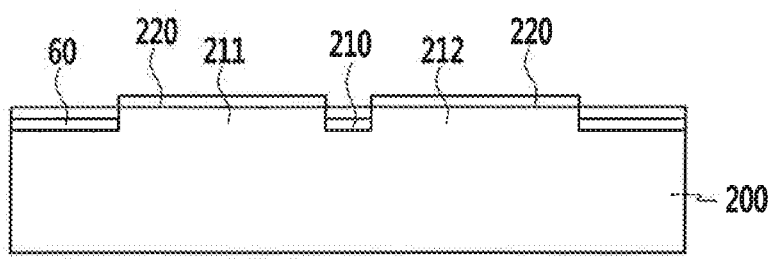

Referring to FIG. 4, after a second photosensitive film pattern 60 is formed on the second semiconductor substrate 200, a metal layer 220 is formed on the second semiconductor substrate 200 and the second photosensitive film pattern 60.

In particular, the second photosensitive film pattern 60 is not formed in the first protrusion 211 and the second protrusion 212 of the second semiconductor substrate 200. Accordingly, only the metal layer 220 is formed on the first protrusion 211 and the second protrusion 212 of the second semiconductor substrate 200.

Figure 5:
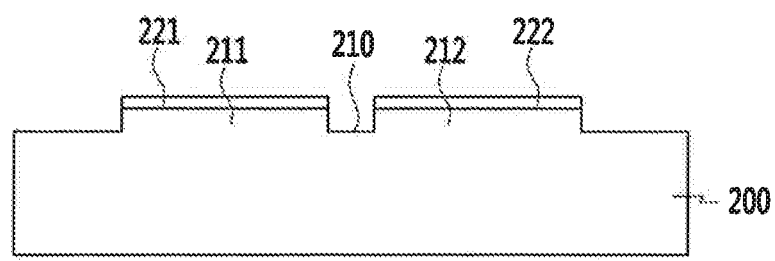

Referring to FIG. 5, the second photosensitive film pattern 60 is removed from the second semiconductor substrate 200 by a lift-off process. In this case, the metal layer 220 positioned on the second photosensitive film pattern 60 is also removed. Accordingly, a first metal layer 221 and a second metal layer 222 are formed on the first protrusion 211 and the second protrusion 212 of the second semiconductor substrate 200, respectively.

According to the present exemplary embodiment, the first metal layer 221 and the second metal layer 222 are formed by the lift-off process without using a mask, but the present invention is not limited thereto, and the first metal layer 221 and the second metal layer 222 may also be formed by using a mask. For example, after the metal layer 220 is formed on the second semiconductor substrate 200 without forming the second photosensitive film pattern 60, the first metal layer 221 and the second metal layer 222 may be formed by etching the metal layer 220 by using a mask.

Figure 6:
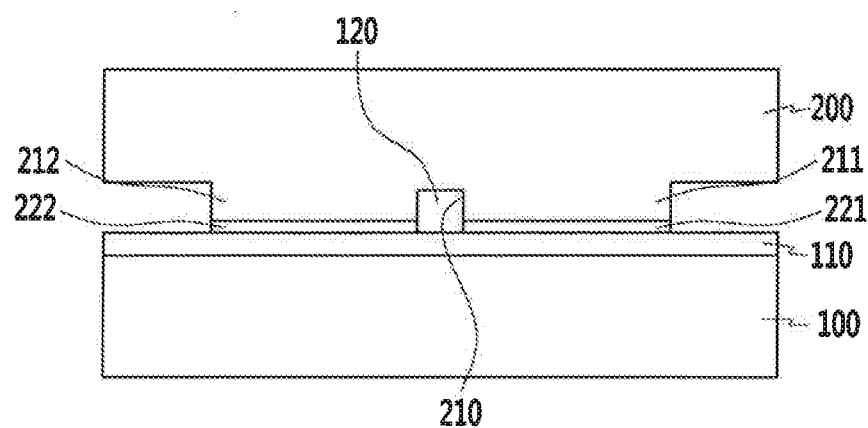

Referring to FIG. 6, the first semiconductor substrate 100 and the second semiconductor substrate 200 are joined. In this case, the alignment key 120 positioned in the first semiconductor substrate 100 is positioned at the alignment recess 210 of the second semiconductor substrate 200. As described above, the alignment key 120 is positioned at the alignment recess 210 when the first semiconductor substrate 100 and the second semiconductor substrate 200 are joined, thereby joining the first semiconductor substrate 100 and the second semiconductor substrate 200 without an alignment error.

In the meantime, a thickness of the alignment key 120 according to the present exemplary embodiment is larger than a thickness of the first metal layer 221 and the second metal layer 222.

When the first semiconductor substrate 100 and the second semiconductor substrate 200 are joined, heat and pressure are generated. The first metal layer 221 and the second metal layer 222 may re-flow and flow down by the heat and the pressure. In this case, the re-flow first metal layer 221 and second metal layer 222 may flow down to be connected with each other.

However, in the present exemplary embodiment, since the alignment key 120 is positioned in the alignment recess 210 disposed between the first protrusion 211 and the second protrusion 212, and the thickness of the alignment key 120 is larger than the thickness of the first metal layer 221 and the second metal layer 222, even though the first metal layer 221 and the second metal layer 222 re-flow and flow down, the first metal layer 221 and the second metal layer 222 may be prevented from being connected with each other. Accordingly, when the semiconductor device is formed by joining the first semiconductor substrate 100 and the second semiconductor substrate 200, it is possible to prevent a defect of the semiconductor device.

In the meantime, a plurality of semiconductor devices may be generally formed in the semiconductor substrate. Accordingly, a plurality of alignment keys 110 may be formed in the first semiconductor substrate 100. Further, a plurality of alignment recesses 210 corresponding to the alignment keys 120 may also be formed in the second semiconductor substrate 200.

As mentioned above, the process of joining the two semiconductor substrates is described in the present exemplary embodiment, but the present invention is not limited thereto, and three or more semiconductor substrates may be joined by the aforementioned joining method. For example, another alignment recess is formed on an opposite surface of a portion in which the alignment recess 210 of the second semiconductor substrate 200 is formed, and then, another substrate (for example, a third semiconductor substrate) in which an alignment key and a metal layer is formed may be joined to the second semiconductor substrate 200. In this case, the alignment key of the third semiconductor substrate is positioned at another alignment recess of the second semiconductor substrate 200.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of joining semiconductor substrates, comprising:
    forming an alignment key on a first semiconductor substrate;
    forming a first protrusion and a second protrusion, and an alignment recess positioned between the first protrusion and the second protrusion on a second semiconductor substrate;
    forming a first metal layer and a second metal layer on the first protrusion and the second protrusion, respectively; and
    joining the first semiconductor substrate and the second semiconductor substrate,
    wherein the alignment key is positioned in the alignment recess when the first semiconductor substrate and the second semiconductor substrate are joined,
    the alignment key is formed of a photosensitive polymer material, and
    a metal is not formed in the alignment recess.

2. The method of claim 1, wherein:
    a thickness of the alignment key is larger than a thickness of the first metal layer and the second metal layer.

3. The method of claim 1, wherein:
    the forming of the first protrusion, the second protrusion, and the alignment recess includes:
    forming a first photosensitive film pattern on the second semiconductor substrate; and
    etching the second semiconductor substrate by using the first photosensitive film pattern as a mask.

4. The method of claim 3, wherein:
    the forming of the first metal layer and the second metal layer includes:
    forming a second photosensitive film pattern on the second semiconductor substrate, except for the first protrusion and the second protrusion;
    forming a metal layer on the second photosensitive film pattern, the first protrusion, and the second protrusion; and
    removing the second photosensitive film pattern and the metal layer positioned on the second photosensitive film pattern by performing a lift-off process.

5. The method of claim 1, further comprising:
    forming an insulating layer on the first semiconductor substrate before forming the alignment key.

* * * * *